United States Patent
Qian et al.

(10) Patent No.: US 10,079,578 B2
(45) Date of Patent: Sep. 18, 2018

(54) TOTAL HARMONIC DISTORTION (THD) CONTROLLED CLIP DETECTOR AND AUTOMATIC GAIN LIMITER (AGL)

(71) Applicant: Texas Instruments Incorporated, Dallas, TX (US)

(72) Inventors: Shun Qian, Shanghai (CN); Kim Nordtorp Madsen, Skovlunde (DK); Lucia Wan, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/642,484

(22) Filed: Jul. 6, 2017

(65) Prior Publication Data

US 2018/0191310 A1    Jul. 5, 2018

Related U.S. Application Data (63) Continuation of application No. PCT/CN2016/113634, filed on Dec. 30, 2016.

(51) Int. Cl.
| | |
|---|---|
| *H03F 3/217* | (2006.01) |
| *H03F 1/32* | (2006.01) |
| *H03F 3/181* | (2006.01) |
| *H03F 1/26* | (2006.01) |
| *H03G 3/20* | (2006.01) |

(52) U.S. Cl.
CPC ............ *H03F 1/32* (2013.01); *H03F 1/26* (2013.01); *H03F 3/181* (2013.01); *H03F 3/217* (2013.01); *H03G 3/20* (2013.01); *H03F 2200/03* (2013.01); *H03F 2200/471* (2013.01); *H03G 2201/106* (2013.01)

(58) Field of Classification Search
CPC ........................................................ H03F 3/217
USPC ........................................ 330/251, 207 A, 2
See application file for complete search history.

(56) References Cited

U.S. PATENT DOCUMENTS

| | | | | |
|---|---|---|---|---|
| 4,978,926 A | * | 12/1990 | Zerod | ............... H03G 3/3026 330/279 |
| 5,001,440 A | | 3/1991 | Zerod | |
| 6,353,359 B1 | * | 3/2002 | Leizerovich | .......... H03F 1/0222 330/129 |
| 8,045,659 B2 | * | 10/2011 | Michael | ............... H03G 3/3068 375/345 |

(Continued)

FOREIGN PATENT DOCUMENTS

| | | |
|---|---|---|
| CN | 101079602 A | 11/2007 |
| CN | 103138687 A | 6/2013 |
| CN | 103326680 A | 9/2013 |

OTHER PUBLICATIONS

International Search Report and Written Opinion for PCT/CN2016/112634, dated Aug. 2, 2017, 11 pages.

*Primary Examiner* — Henry Choe
(74) *Attorney, Agent, or Firm* — John R. Pessetto; Charles A. Brill; Frank D. Cimino (57) ABSTRACT

The disclosed embodiments include an audio amplifier system configured to provide a total harmonic distortion (THD) controlled clip detector and an automatic gain limiter (AGL) solution for a closed-loop amplifier. The audio amplifier system is capable of maintaining high power output without hard distortion (i.e., hard clipping) for providing better acoustics, while preventing damage to the system.

15 Claims, 4 Drawing Sheets

(56) References Cited

U.S. PATENT DOCUMENTS

| | | | | |
|---|---|---|---|---|
| 8,289,075 | B2* | 10/2012 | Kishii | H03F 3/217 330/207 A |
| 9,559,648 | B2* | 1/2017 | Cotton | H03F 3/45479 |
| 2011/0063027 | A1* | 3/2011 | Kishii | H03F 3/217 330/251 |
| 2011/0221529 | A1* | 9/2011 | Maejima | H03F 3/217 330/207 A |
| 2012/0154044 | A1* | 6/2012 | Hirano | H03F 3/217 330/251 |
| 2017/0232122 | A1* | 8/2017 | Hancock | A61L 2/0011 604/23 |
| 2017/0254842 | A1* | 9/2017 | Bahl | G01R 15/04 |

* cited by examiner

TOTAL HARMONIC DISTORTION (THD) CONTROLLED CLIP DETECTOR AND AUTOMATIC GAIN LIMITER (AGL)

BACKGROUND

The present disclosure relates generally to an audio amplifier. An amplifier is an electronic device that increases the voltage, current, or power of a signal. Audio amplifiers are used in audio equipment of all kinds such as speakers, hearing aids, mobile phones, home theatre audio systems, and electric guitars. When an audio amplifier is pushed to create a signal with more power than its power supply can produce, it will amplify the signal only up to its maximum capacity, at which point the signal simply "cuts" or "clips" at the maximum capacity of the amplifier. The extra signal which is beyond the capability of the amplifier is simply cut off, resulting in a sine wave becoming a distorted square-wave-type waveform, thus causing audio distortions and potential speaker damage due to bigger averaged output power than the driven speaker is normally rated.

SUMMARY

In accordance with at least one embodiment of the invention, an audio amplifier system includes an attenuator configured to adjust an electrical signal to generate an attenuated signal. The attenuator is coupled to an amplifier that is configured to amplify the attenuated signal to generate an amplified signal, and modulate the amplified signal to output a pulse width modulated (PWM) signal. A voltage controlled current source (VCCS) is coupled to the amplifier. The VCCS is configured to generate a feedback clip error signal. A clip detector is configured to generate a clip indication signal indicating target distortion level.

In an embodiment, the clip detector includes a sense resistor and an amplifier feedback resistor configured to generate an overdrive voltage based on the feedback clip error signal. The clip detector also includes a multiplexor configured to select a power supply voltage (PVCC) or a predetermined voltage reference (VREF) as a reference source. A voltage divider is configured to receive the reference source to generate a scaled reference voltage, and a comparator is configured to compare the overdrive voltage and the scaled reference voltage to generate a relative overdrive signal. The clip detector may also include a debouncer that is configured to filter the relative overdrive signal to reduce noise and generate the clip indication signal.

In an embodiment, the amplifier is a closed-loop class D amplifier configured to receive the attenuated signal, a feedback output signal of the amplifier, and the feedback clip error signal as input. In an embodiment, the VCCS is coupled to an input channel of a PWM comparator of the amplifier, and generates the feedback clip error signal by comparing an amplified error signal generated by the amplifier to a stable reference signal.

In an embodiment, the audio amplifier system includes a gain control finite-state-machine (FSM) coupled to the clip detector and configured to control the attenuator using the clip indication signal. The audio amplifier system may also include a counter configured to count clip events. Further, in some embodiments, a maximum non-clip power limit of the audio amplifier system and/or a total harmonic distortion (THD) output of the audio amplifier system may be controlled by adjusting a sense resistor and/or a scaled reference voltage.

The disclosed embodiments further include a method for controlling a total harmonic distortion output of an audio system. In an embodiment, the method includes generating an amplified error signal, generating a feedback clip error signal by comparing the amplified error signal to a stable reference signal, generating an overdrive voltage based on the feedback clip error signal using a sense resistor and an amplifier feedback resistor, generating a scaled reference voltage using a voltage divider and a reference source, generating a relative overdrive signal based on the overdrive voltage and the scaled reference voltage, generating a clip indication signal by filtering the relative overdrive signal to reduce noise, and controlling the amplifier maximum output power below a controlled target THD level at output based on the clip indication signal.

BRIEF DESCRIPTION OF THE DRAWINGS

For a detailed description of various examples, reference will now be made to the accompanying drawings in which.

The illustrated figures are only exemplary and are not intended to assert or imply any limitation with regard to the environment, architecture, design, or process in which different embodiments may be implemented.

DETAILED DESCRIPTION

Current audio amplifier systems provide inadequate clip detection capabilities. For example, some will detect critical clipping only for a specific output level. Some audio amplifier systems are subject to gain mismatching and/or require the use of an additional programmable gain amplifier (PGA) amplifier. Still, some audio amplifier systems are sensitive to pulse-width modulation (PWM) and signal frequency variation. In addition, some audio amplifier systems may be sensitive to delay of ramp, driver and PWM comparators.

The disclosed embodiments seek to provide solutions to one or more of the above problems associated with current audio amplifier systems, and provide an audio amplifier system that maintains high power output without hard distortion (i.e., hard clipping) for providing better acoustics, while preventing damage to the system.

The disclosed embodiments may be applied to an audio amplifier system for performing clip detection only and/or may be applied to an integrated automatic gain limiter (AGL) solution. As one example, the disclosed embodiments may enable different total harmonic distortion (THD) levels to be chosen when reporting the clip detection on closed loop Class-D amplifiers. In one embodiment, this is done by directly sensing the "overdrive" current at input from a loop clamp. This current is then fed into a replica resistor to get the effective "overdrive voltage." The overdrive voltage is compared to a scaled reference voltage for relative overdrive to determine the THD level at the deemed clip event.

Figure 1:
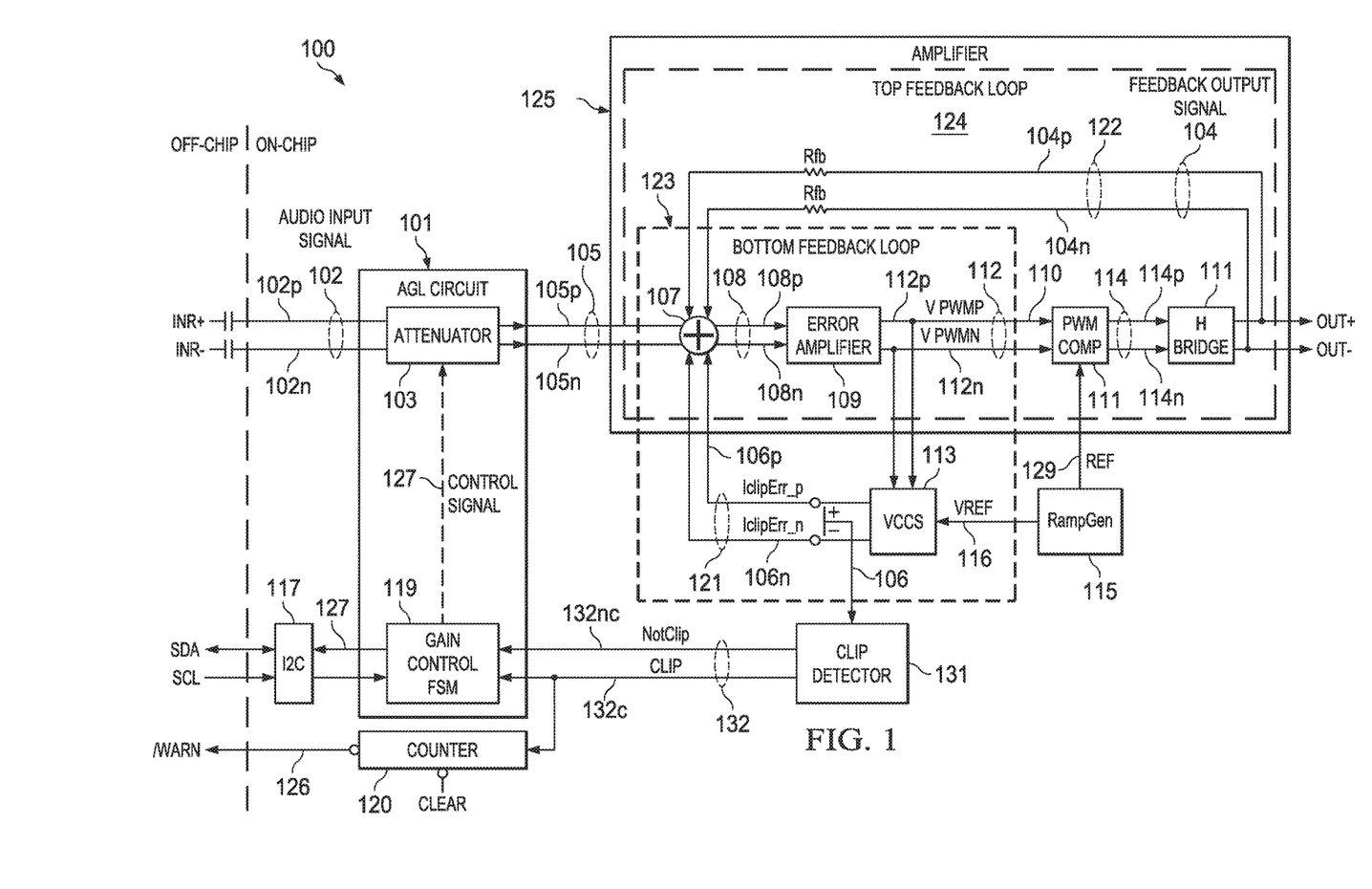
FIG. 1 illustrates an audio amplifier system configured to provide a total harmonic distortion (THD) controlled clip detector and an automatic gain limiter (AGL) solution for a closed-loop amplifier in accordance with an embodiment of the present disclosure.

Referring now to the drawings, FIG. 1 illustrates an audio amplifier system 100 configured to provide a total harmonic distortion (THD) controlled clip detector and AGL solution for a closed-loop amplifier in accordance with an embodiment of the present disclosure. The audio amplifier system 100 may be a standalone component or may be integrated into another system through an inter-integrated circuit (I2C) bus interface 117. In the depicted embodiment, the audio amplifier system 100 includes an AGL circuit 101, an amplifier 125, and a clip detector 131.

In one embodiment, the AGL circuit 101 includes an attenuator 103 and a gain control finite-state-machine (FSM) 119. Attenuator 103 is an electronic device which may reduce the amplitude or power of an audio signal without causing a significant distortion to its waveform. As will be further described, the gain control FSM 119 is an electronic device that is configured to store the status of the audio amplifier system 100 at a given time. The gain control FSM 119 is configured to receive input such as a signal indicating whether an audio signal is being clipped and change one or more status of the audio amplifier system 100. The gain control FSM 119 may also cause an action or output to take place for any status change.

In one embodiment, the amplifier 125 is a class-D amplifier or a switching amplifier. A class-D amplifier is an electronic amplifier in which the amplifying devices (e.g., transistors) operate as electronic switches, and not as linear gain devices as in other types of amplifiers. In the depicted embodiment, the amplifier 125 includes an adder 107, an error amplifier 109, a pulse-width modulation (PWM) comparator 110, an H-bridge 111, and a top feedback channel 122. The adder 107, the error amplifier 109, the PWM comparator 110, the H-bridge 111, and the top feedback channel 122 together form a top feedback loop 124 of the audio amplifier system 100. As will be further described, the audio amplifier system 100 also includes a bottom feedback loop 123 including a VCCS 113, the adder 107, and the error amplifier 109, and the bottom feedback channel 121.

As shown in FIG. 1, an audio input signal 102, including positive and negative signals (102p and 102n), is provided to the attenuator 103 located in the AGL circuit 101. In one embodiment, during an initial cycle, the attenuator 103 generates an attenuated audio input signal 105, including positive and negative signals (105p and 105n), from the audio input signal 102 and provides the attenuated audio input signal 105 to the adder 107 of the amplifier 125. The adder 107 receives the attenuated audio input signal 105 and performs a summation of (i) the attenuated audio input signal 105, (ii) a feedback output signal 104, including positive and negative signals (104p and 104n) of the amplifier 125, and (iii) a feedback clip error signal 106 including positive and negative signals (106p and 106n). Both the feedback output signal 104 and the feedback clip error signal 106 may be zero during the initial cycle. The adder 107 passes the summed audio input signal 108 including positive and negative signals (108p and 108n) to the error amplifier 109. The error amplifier 109 amplifies an error difference between the feedback output signal 104 and the summed audio input signal 108 to generate an amplified error signal 112 including positive and negative signals (112p and 112n). The amplified error signal 112 is provided to the PWM comparator 110. The PWM comparator 110 compares the amplified error signal 112 to a stable reference (REF) signal 129 (e.g., a reference voltage or a ramp waveform) that is generated by a ramp generator 115 to generate a compensating error signal 114 (i.e., a compensating error voltage), including positive and negative signals (114p and 114n). The PWM comparator 110 then provides the compensating error signal 114 to the H-bridge 111. The H-bridge 111 includes a pair of switches that reciprocally switch back and forth between fully conductive and nonconductive states. The compensating error signal 114 causes the switches to switch state to generate the feedback output signal 104 (i.e., an amplified output pulse train). The compensating error signal 114 drives the feedback output signal 104 (i.e., output voltage of the amplifier 125) closer to a desired level or strength. The feedback output signal 104 is provided back to the adder 107 through the top feedback channel 122 to be combined with the attenuated audio input signal 105 and the feedback clip error signal 106.

As described above, the amplifier 125 performs the amplification in a closed-loop state, meaning all or a portion of its output is used as its input. However, the amplifier 125 may process an audio signal that is within its power supply limits in the closed-loop state. If the audio input signal 102 is larger than an allowed power supply of the amplifier 125, a clipping (i.e., hard distortion) occurs and the top feedback loop 124 changes to a saturated or opened-loop state. When this occurs, the bottom feedback loop 123 becomes active and changes the amplifier 125 to a closed-loop state again.

In the depicted embodiment, the VCCS 113 is coupled to the input lines of the PWM comparator 110 to receive the amplified error signal 112 (112p and 112n). The VCCS 113 determines the difference between the amplified error signal 112 and a stable reference signal (e.g., a VREF signal 116 provided by the ramp generator 115) by performing a summation or a subtraction to generate the feedback clip error signal 106 (e.g., clip error + and clip error −). The feedback clip error signal 106 (also known as an overdrive current) represents the audio power outside of the allowed power supply limits of the audio amplifier system 100. The VCCS 113 provides the feedback clip error signal 106 (106p and 106n) back to the adder 107 through the bottom feedback channel 121. In an embodiment, the VCCS 113 converts the feedback clip error signal 106 from a voltage representation to a current representation.

As depicted in FIG. 1, the audio amplifier system 100 includes a clip detector 131 that is configured to sense the feedback clip error signal 106 while it is being sent to the adder 107 in the bottom feedback channel 121. As will be further described below, the clip detector 131 generates a clip indication signal 132 including clip (132c) and Not Clip (132nc) signals. The clip detector 131 provides the clip indication signal 132 to the gain control FSM 119 of the AGL circuit 101.

The gain control FSM 119 receives the clip indication signal 132, generates a control signal 127 based on the clip indication signal 132, and provides the control signal 127 to the attenuator 103 and, in some embodiments, to the I2C bus interface 117. The attenuator 103 adjusts the audio input signal 102 going into the amplifier 125 based on the control signal 127. The I2C bus interface 117 enables the audio amplifier system 100 to be integrated with other systems or components, for example, by a serial data line (SDA) for output and a serial clock line (SCL) for input, to further provide an integrated AGL solution.

Additionally, in certain embodiments, the audio amplifier system 100 includes a counter 120 coupled to the clip (132c) line. The clip detector 131 is configured to send the clip event to the counter 120 to a pin for system level AGL solution which attenuates the input signal externally or internally thru the I2C bus interface 117. In an embodiment, the counter 120 maintains a count of clip events that occurs in the audio amplifier system 100 and may generate a clip warning signal 126. In some embodiments, a rising (or falling) edge of the clip indication signals 132c may trigger the counter 120 to increment its count.

While not shown in FIG. 1, in an embodiment, the bottom feedback channel 121 may also include feedback resistors (Rfb), as shown with the top feedback channel 122. In some embodiments, the feedback output signal 104 may be filtered by a passive low-pass filter to produce an output audio signal that is provided to other devices or components, such as speakers.

Figure 2:
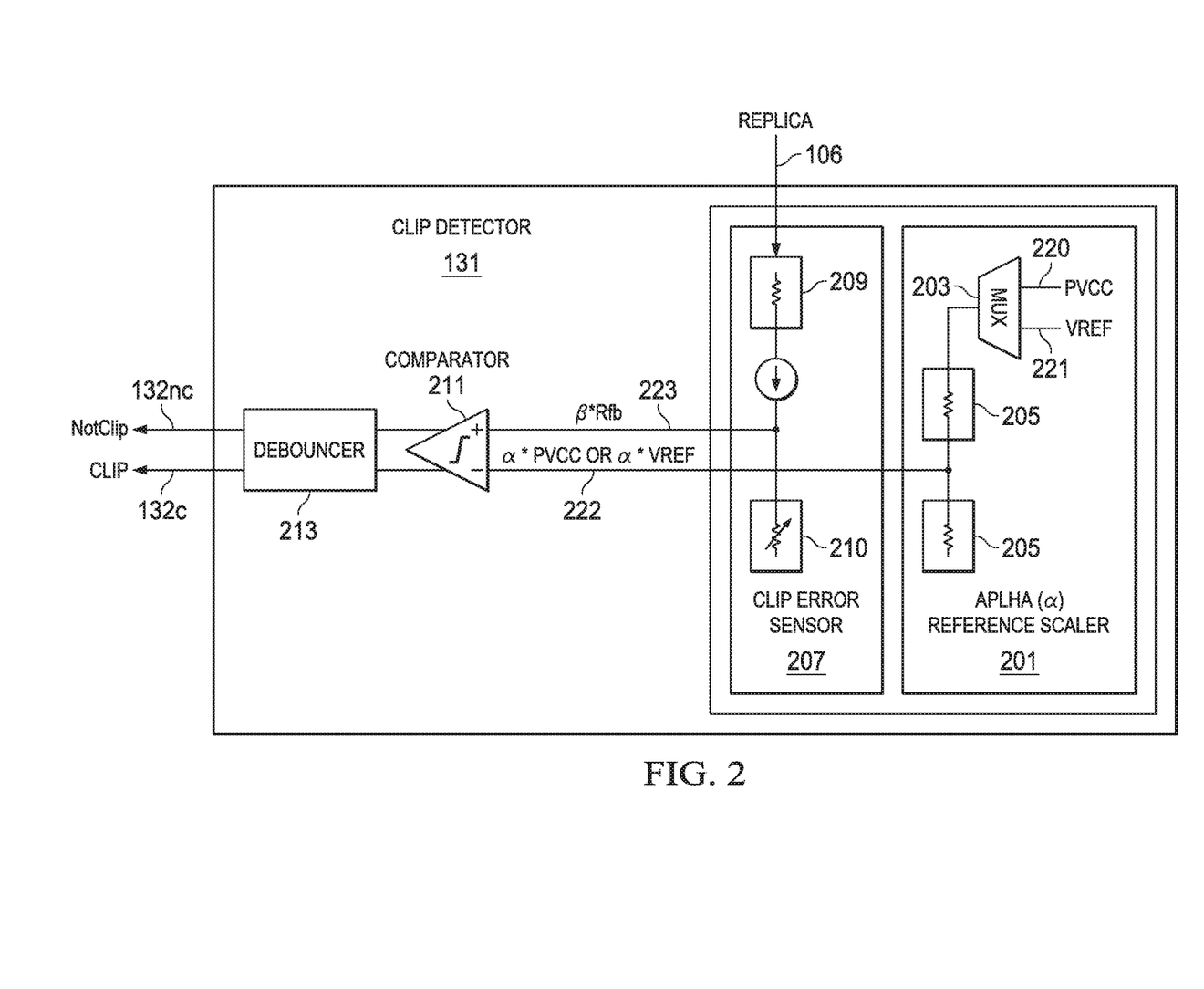
FIG. 2 illustrates an example of a clip detector according to an embodiment of the disclosure.

Reference is now made to FIG. 2, which illustrates an example of a clip detector 131 according to an embodiment of the disclosure. In the depicted embodiment, the clip detector 131 includes an alpha ($\alpha$) reference scaler 201, a clip error sensor 207, a comparator 211, and a debouncer 213. The alpha ($\alpha$) reference scaler 201 includes a multiplexer (MUX) 203 and a voltage divider 205. The MUX 203 selects either a PVCC 220 (e.g., the power supply of the amplifier 125) or a predetermined VREF 221 as a reference source to be provided to the voltage divider 205. The voltage divider 205 produces a scaled reference voltage 222, which can be represented by the formulas $\alpha*PVCC$ or $\alpha*VREF$ (where $\alpha$ represents the voltage division factor implemented by the voltage divider).

The clip error sensor 207 comprises a sense resistor 209 and an amplifier feedback resistor Rfb 210. As shown in FIG. 1, the sense resistor 209 replicates a current that is equivalent to the feedback clip error signal 106 and biases the current onto the amplifier Rfb 210 to generate an overdrive voltage 223, which can be represented by the formula $\beta*R_{fb}$. The overdrive voltage 223 represents the voltage in excess of a maximum non-clip power level.

The comparator 211 receives the scaled reference voltage 222 and the overdrive voltage 223. The comparator 211 compares the scaled reference voltage 222 and the overdrive voltage 223 to generate a relative overdrive signal 224 to determine the THD output level at the detected clip event. The relative overdrive signal 224 is fed into the debouncer 213. The debouncer 213 filters the relative overdrive signal 224 to reduce noise. The debouncer 213 generates the clip indication signal 132 to indicate whether the audio input signal 102 was clipped (as indicated by clip signal 132c) to flag clip events or not clipped (as indicated by not clip signal 132nc).

Figure 3:
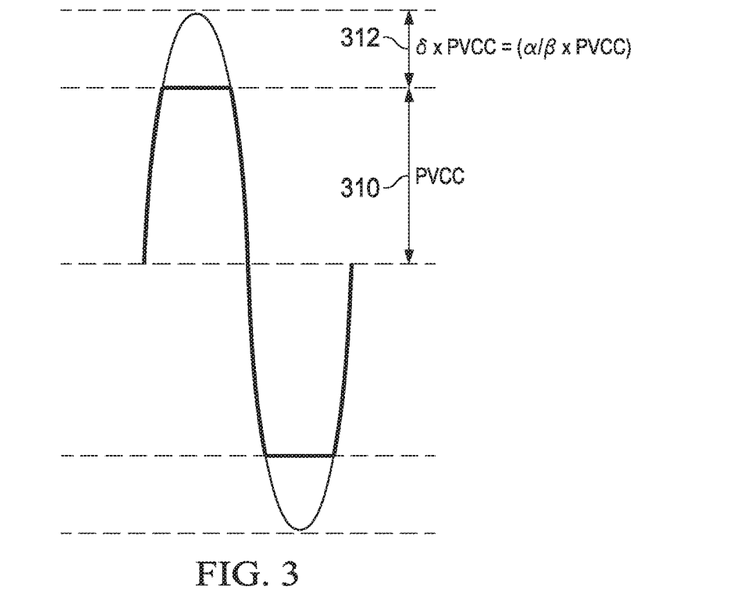
FIG. 3 illustrates an audio input signal having a non-clipped portion and a clipped portion according to an embodiment of the disclosure.

In addition to determining whether the audio input signal 102 is clipped or not clipped, in some embodiments, the $\alpha$ coefficient and the $\beta$ coefficient can be used to determine a delta ($\delta$) coefficient (e.g., $\delta=\alpha/\beta$), which may be used to control the THD of the audio amplifier system 100 using the AGL 101. As shown in FIG. 3, the audio input signal has a non-clipped portion 310 that is within the PVCC of the audio amplifier system 100 and a clipped portion 312 that is outside of the PVCC of the audio amplifier system 100. The clipped portion 312 is represented by the formula $\delta*PVCC$, which is the same as $\alpha/\beta*PVCC$. Thus, by adjusting the sense resistor, which modifies $\beta$, and/or the reference scaling ($\alpha$), a specific THD output level and output power at clip detection can be tuned. For example, in one embodiment, if $\delta$ is set to 0.282, then THD=10%.

Figure 4:
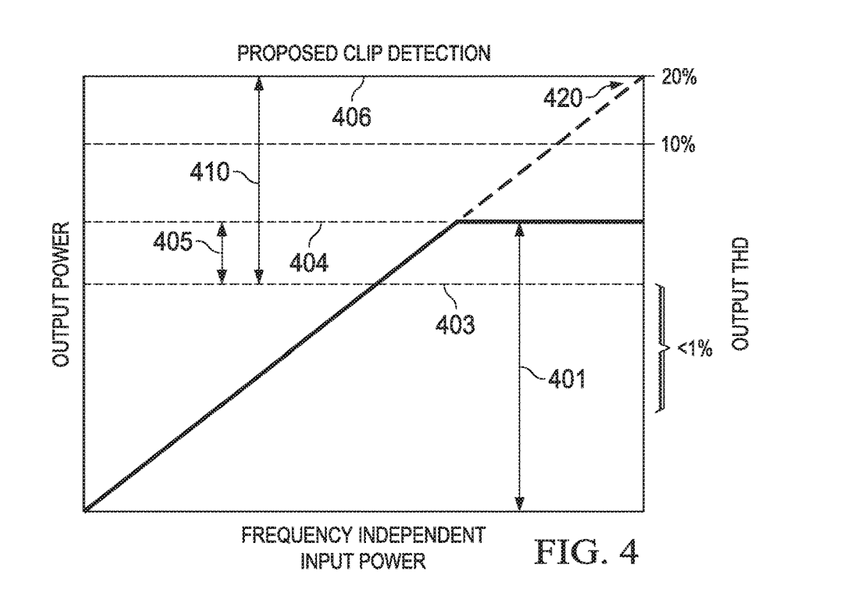
FIG. 4 is a chart that illustrates input power versus output power and THD output in accordance with an embodiment of the present disclosure.

FIG. 4 is a chart that illustrates maximum output power versus input power and maximum output THD in accordance with an embodiment of the present disclosure as clip detecting AGL. The maximum non-clip power level for other types of clip detectors is indicated at level 403. Level 406 corresponds to 20% THD where a hard clip will occur as indicated by reference 420. Although not depicted, a harder clipped distortion (e.g., 50% THD) is possible with enough overdrive and when a sinewave eventually becomes too rectangular shape. As shown in FIG. 4, the maximum non-clip power level 403 is set well below the maximum power level 406 for other types of clip detectors which can only detect critical clipping and so that there is very small output power and little (<1%) THD. For some other clip detectors which are sensitive to signal or PWM switching frequency for class-D amplifier, the THD or output power level can even vary and be inconsistent. However, in accordance with the disclosed embodiments, the maximum non-clip power level and THD output can be controlled as described above. For instance, in the depicted embodiment, for any input power/frequency 401, the maximum non-clip power level has increased from level 403 to level 404 independent of signal or PWM switching frequency for class-D amplifier. Range 405 indicates the increased amount in the maximum non-clip power. Range 410 indicates the controllable range of the disclosed embodiments. Therefore, the disclosed embodiments are able to control the audio amplifier system to produce a desired power output and THD output level.

Figure 5:
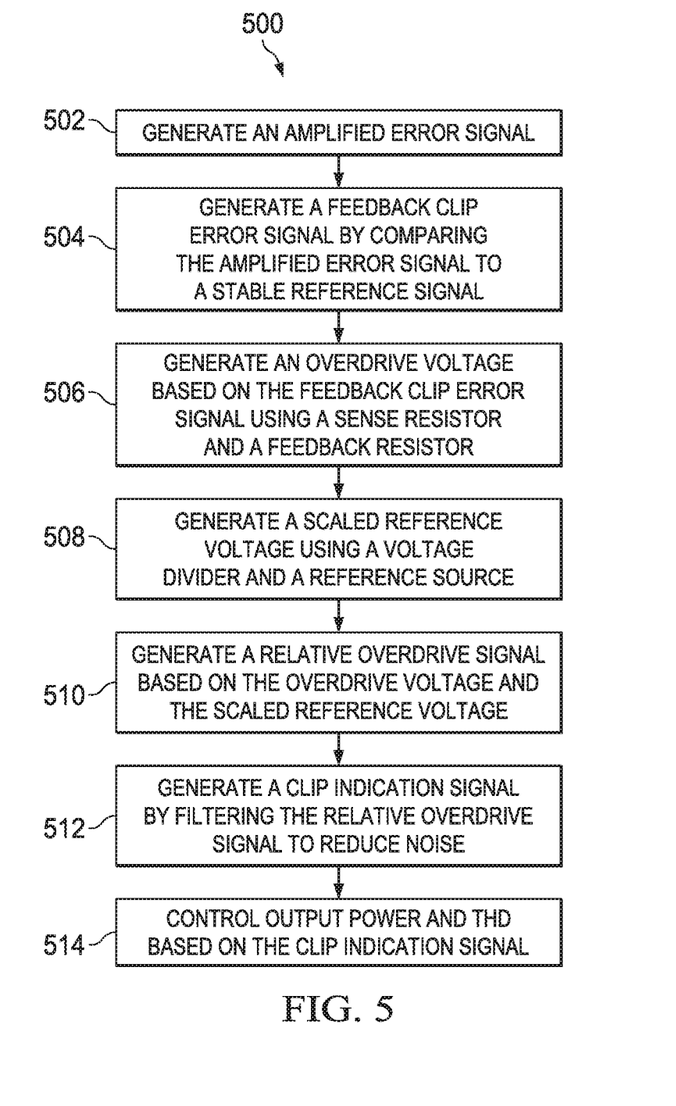
FIG. 5 is a flowchart that illustrates a method for controlling a THD output of an audio system in accordance with an embodiment of the present disclosure.

FIG. 5 is a flowchart that illustrates a method 500 for controlling a total harmonic distortion output of an audio system in accordance with an embodiment of the present disclosure. In the depicted embodiment, the method 500 begins by generating an amplified error signal at step 502. In some embodiments, the method may further include the step of receiving a summed audio input signal comprising an attenuated audio input signal, an amplifier feedback output signal, and a feedback clip error signal for generating the amplified error signal. At step 504, the method generates a feedback clip error signal by comparing the amplified error signal to a stable reference signal. The method generates an overdrive voltage ($\beta*R_{fb}$) based on the feedback clip error signal using a sense resistor and a feedback resistor at step 506. At step 508, the method generates a scaled reference voltage ($\alpha*PVCC$ or $\alpha*VREF$) using a voltage divider and a reference source. As mentioned above, $\alpha$ represents the voltage division factor implemented by the voltage divider. At step 510, the method generates a relative overdrive signal based on the overdrive voltage and the scaled reference voltage. The method generates a clip indication signal by filtering the relative overdrive signal to reduce noise at step 512. At step 514, the method controls an output power and THD based on the clip indication signal. In some embodiments, the method may further include the step of modifying the clip indication signal by adjusting at least one of the sense resistor and the scaled reference voltage.

The advantages of the disclosed embodiments include, but are not limited to, larger output power over other types of clip detectors and non-clip detectors (e.g., 20%-50% higher than a non-clip detector). Further, the clipped output power portion may be controllable by THD level (e.g., 2% 5% 10% or higher) and in certain embodiments, the audio amplifier system is independent of the audio input signal frequency (Fsig), the PVCC of the amplifier, and switching frequency (Fsw).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

As used in the written description and the claims, the terms "including" and "comprising," and variations thereof, should be interpreted to mean "including, but not limited to." Unless otherwise specified, the term "couple" or "couples" is not limited to a direct connection, but instead may include an indirect connection via other devices or components.

What is claimed is:

1. An audio amplifier system comprising:
an attenuator configured to adjust an electrical signal to generate an attenuated signal;
an amplifier coupled to the attenuator and configured to amplify and modulate the attenuated signal;
a voltage controlled current source (VCCS) coupled to the amplifier and configured to generate a feedback clip error signal;
a clip detector configured to generate a clip indication signal, wherein the clip detector comprises:
a sense resistor and a feedback resistor configured to generate an overdrive voltage based on the feedback clip error signal;
a multiplexer configured to select one of a power supply voltage (PVCC) and a predetermined voltage reference (VREF) as a reference source;
a voltage divider configured to receive the reference source to generate a scaled reference voltage; and
a comparator configured to compare the overdrive voltage and the scaled reference voltage to generate a relative overdrive signal.

2. The audio amplifier system of claim 1, wherein the clip detector further comprises a debouncer configured to filter the relative overdrive signal to reduce noise and generate the clip indication signal.

3. The audio amplifier system of claim 1, wherein the amplifier is a closed-loop class D amplifier configured to receive the attenuated signal, a feedback output signal of the amplifier, and the feedback clip error signal as input.

4. The audio amplifier system of claim 1, wherein the VCCS is coupled to an input channel of a PWM comparator of the amplifier.

5. The audio amplifier system of claim 1, wherein the VCCS generates the feedback clip error signal by comparing an amplified error signal generated by the amplifier to a stable reference signal.

6. The audio amplifier system of claim 1, further comprising a gain control finite-state-machine (FSM) coupled to the clip detector and configured to control the attenuator using the clip indication signal.

7. The audio amplifier system of claim 6, wherein at least one of the sense resistor and the scaled reference voltage are adjustable to control the attenuator to increase or decrease a maximum power limit that corresponds to allowed total harmonic distortion (THD) level of the audio amplifier system at output.

8. A clip detector comprising:
a sense resistor and a feedback resistor configured to generate an overdrive voltage based on a feedback clip error signal;
a multiplexer configured to select one of a power supply voltage (PVCC) and a predetermined voltage reference (VREF) as a reference source;
a voltage divider configured to receive the reference source to generate a scaled reference voltage;
a comparator configured to compare the overdrive voltage and the scaled reference voltage to generate a relative overdrive signal; and
a debouncer configured to filter the relative overdrive signal to reduce noise and generate a clip indication signal.

9. The clip detector of claim 8, wherein the sense resistor is configured to receive the feedback clip error signal from a voltage controlled current source (VCCS) coupled to an amplifier.

10. The clip detector of claim 8, wherein the debouncer is configured to send the clip indication signal to a gain control finite-state machine (FSM) of an automatic gain limiter (AGL) circuit.

11. The clip detector of claim 8, wherein at least one of the sense resistor and the scaled reference voltage are adjustable to control a total harmonic distortion (THD).

12. An audio amplifier system comprising:
an attenuator configured to adjust an electrical signal to generate an attenuated signal;
a closed-loop class D amplifier configured to receive the attenuated signal, a feedback output signal of the closed-loop class D amplifier, and a feedback clip error signal as input;
a voltage controlled current source (VCCS) coupled to the closed-loop class D amplifier and configured to generate the feedback clip error signal; and
a clip detector configured to receive the feedback clip error signal, and generate a clip indication signal;
wherein the clip detector comprises:
a sense resistor and a feedback resistor configured to generate an overdrive voltage based on the feedback clip error signal;
a multiplexer configured to select one of a power supply voltage (PVCC) and a predetermined voltage reference (VREF) as a reference source;
a voltage divider configured to receive the reference source to generate a scaled reference voltage;
a comparator configured to compare the overdrive voltage and the scaled reference voltage to generate a relative overdrive signal; and
a debouncer configured to filter the relative overdrive signal to reduce noise and generate the clip indication signal.

13. A method for controlling a total harmonic distortion output of an audio system, the method comprising:
generating an amplified error signal;
generating a feedback clip error signal by comparing the amplified error signal to a stable reference signal;
generating an overdrive voltage based on the feedback clip error signal using a sense resistor and a feedback resistor;
generating a scaled reference voltage using a voltage divider and a reference source;
generating a relative overdrive signal based on the overdrive voltage and the scaled reference voltage;
generating a clip indication signal by filtering the relative overdrive signal to reduce noise; and
controlling a maximum output power and total harmonic distortion (THD) through internal or external signal attenuation based on the clip indication signal.

14. The method of claim 13, receiving a summed audio input signal comprising an attenuated audio input signal, an amplifier feedback output signal, and a feedback clip error signal for generating the amplified error signal.

15. The method of claim 13, further comprising modifying the clip indication signal by adjusting at least one of the sense resistor and the scaled reference voltage.

* * * * *